United States Patent
Clark et al.

(10) Patent No.: US 8,451,071 B2
(45) Date of Patent: May 28, 2013

(54) LOW NOISE OSCILLATORS

(75) Inventors: Roger L. Clark, Windham, NH (US); William W. Cooper, Townsend, MA (US); Janis R. Cooper, legal representative, Townsend, MA (US); Mark J. Gugliuzza, Tewksbury, MA (US); Benjamin J. Annino, Boston, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/088,733

(22) Filed: Apr. 18, 2011

(65) Prior Publication Data

US 2011/0193641 A1 Aug. 11, 2011

Related U.S. Application Data

(63) Continuation-in-part of application No. 12/276,596, filed on Nov. 24, 2008, now abandoned.

(51) Int. Cl.
*H03L 7/099* (2006.01)
(52) U.S. Cl.
USPC ............ 331/185; 331/109; 330/285; 330/298
(58) Field of Classification Search
USPC ................ 331/109, 185, 18, 47, 57; 330/279, 330/285, 298; 327/156, 157, 158
See application file for complete search history.

(56) References Cited

U.S. PATENT DOCUMENTS

| | | | |
|---|---|---|---|
| 5,854,578 A | 12/1998 | Minasi et al. | |
| 6,025,754 A | 2/2000 | Czora | |
| 6,606,006 B1 | 8/2003 | Alexandersson | |
| 7,262,665 B1 * | 8/2007 | Jin et al. | 330/279 |
| 7,292,104 B1 | 11/2007 | Liwinski | |
| 7,348,854 B1 * | 3/2008 | Mordkovich | 330/298 |
| 7,432,772 B2 * | 10/2008 | Mattisson | 331/158 |
| 2010/0127786 A1 | 5/2010 | Clark et al. | |

FOREIGN PATENT DOCUMENTS

EP 1 473 826 A1 11/2004
EP 1473826 A1 11/2004

OTHER PUBLICATIONS

Notification of Transmittal of the International Search Report and the Written Opinion of the International Searching Authority or the Declaration, PCT/US2009/063666, mailing dated Jan. 12, 2010, 6 pages.
Written Opinion of the International Searching Authority, PCT/US2009/063666, mailing date Jan. 12, 2010, 6 pages.
Feedback Fundamentals Basic Concepts and Circuit Topologies, Gary Breed Editorial Director Jul. 2006 High Frequency Electronics Copyright © 2006 Summit Technical Media, Fig.4.

(Continued)

*Primary Examiner* — Joseph Chang
*Assistant Examiner* — Jeffrey Shin
(74) *Attorney, Agent, or Firm* — Daly, Crowley, Mofford & Durkee, LLP

(57) ABSTRACT

An oscillator having: (A) a transistor for producing an oscillating output signal at an output electrode of the transistor. The oscillator includes; (B) a bias circuit for producing a bias signal for the transistor, said bias circuit including an amplifier coupled to the output electrode of the transistor; and (C) a circuit coupled between an output of the amplifier and a control electrode of the transistor, for isolating the bias signal provided by the amplifier from the oscillating signal.

13 Claims, 2 Drawing Sheets

OTHER PUBLICATIONS

D.B. Leeson, A Simple Model of Feedback Oscillator Noise Spectrum, Proc. IEEE, vol. 54, pp. 329-330, Feb. 1966.

Eva S. Ferre-Pikal, Fred L. Walls, Reduction of Phase Noise in Linear HBT Amplifiers Using Low-Frequency Active Feedback, IEEE Transactions 51, No. 8, Aug. 10, 2004.

Eva S. Ferre-Pikal, Fred L. Walls, Guidelines for Designing BJT Amplifiers with Low 1/f AM and PM Noise, IEEE Transactions on Itrasound . . . Mar. 1997.

Triquint Semiconductor Product Application Note Nov. 6, 2001 Robust Bias Option for 0.15 m pHEMPT Low Noise Apmlifier.

U.S. Appl. No. 12/276,596, filed Nov. 24, 2008.

Notification concerning Transmittal of International Preliminary Report on Patentability, (Chapter I of the Patent Cooperation Treaty), PCT/US2009/063666, dated Jun. 3, 2011, 1 page.

International Preliminary Report on Patentability, PCT/US2009/063666, dated Jun. 3, 2011, 1 page.

Written Opinion of the International Searching Authority, PCT/US2009/063666, dated Jun. 3, 2011, 5 pages.

Notification of Transmittal of the International Search Report and Written Opinion of the International Searching Authority, or the Declaration, PCT/US2012/032875, dated Jul. 17, 2012.

International Search Report, PCT/US2012/032875, dated Jul. 17, 2012.

Written Opinion of the International Searching Authority, PCT/US2012/032875, dated Jul. 17, 2012.

\* cited by examiner

LOW NOISE OSCILLATORS

CROSS REFERENCE TO RELATED APPLICATION

This application is a continuation in part of copending U.S. patent application Ser. No. 12/276,596 filed Nov. 24, 2008, incorporated herein by reference.

TECHNICAL FIELD

The present invention relates to RF oscillators and more particularly to RF oscillators having low levels of phase noise.

BACKGROUND

As is known in the art, low noise oscillators have a wide range of applications such as in navigation, radars and communication systems. As is also known in the art, with transistor oscillators, 1/f noise from the transistors may significantly degrade oscillator phase noise. One technique used to produce low noise oscillators is to screen oscillator transistors for devices having low phase noise. This is time consuming, costly and can sometimes lead to unpredictable yields. Obtaining RF transistors with 1/f noise much less than 1 kHz is desired, but is generally considered impractical. More particularly, RF oscillator phase noise is a dominant factor limiting the performance of many systems. A time based related attribute is the short-term stability or Allan variance. The basic mechanisms of phase noise generation in oscillators are well understood and described in the literature. An example is the model described D. B. Leeson in an article by D. B. Leeson, entitled "A simple model of feedback oscillator noise spectrum," Proc. IEEE, vol. 54, pp. 329-330, February 1966. This oscillator model is commonly referred to as "Leeson's model". Many techniques are employed to reduce the phase noise of oscillators, but generally these techniques relate to using transistors with lower 1/f phase noise or higher Q resonators in the feedback circuit.

Phase noise is often described by its spectral properties. For example, phase noise can have a $1/f^n$ characteristic, with n being an integer. For oscillator circuits, n generally varies from 0 to 3. As described in by D. B. Leeson, in the paper entitled "A simple model of feedback oscillator noise spectrum," Proc. IEEE, vol. 54, pp. 329-330, February 1966, electronic noise within the resonator bandwidth is increased such that 1/f phase noise is converted into $1/f^3$ phase noise when the device is embedded into a high Q oscillator circuit. The implication of this conversion is that phase noise within the resonator bandwidth is greatly increased. Obtaining lower phase noise then requires either lower 1/f phase noise transistors or higher Q resonators. In particular, the 1/f phase noise of a RE transistor relates to the phase noise at small offset frequencies from the center resonance frequency of the oscillation signal. For example, when referring to 1/f phase noise in a 1 GHz oscillator, the 1/f term applies to noise having a 1/f spectral shape when offset from the 1 GHz output. Although transistor 1/f phase noise is generally attributed to material and surface defects, the precise mechanisms are not well understood.

The origin of 1/f phase noise can be associated with the actual 1/f voltage noise of the transistor, but the specific mechanisms of conversion are also not well understood. One mechanism that converts 1/f voltage noise to 1/f phase noise in bipolar transistors is modulation of collector-to-base capacitance resulting from 1/f voltage noise between the collector and base control electrodes. A similar mechanism that converts 1/f voltage noise to 1/f phase noise in field effect transistors is modulation of source-to-base capacitance resulting from 1/f noise between the source and gate control electrodes. Obtaining RF transistors having very low 1/f phase noise is quite difficult due to compromises between RF performance and 1/f noise.

An analysis was presented by Eva S. Ferre-Pikal, Fred L. Walls, in a paper entitled Guidelines for Designing BIT Amplifiers with Low 1/f AM and PM noise, IEEE Transactions on Ultrasonics, Ferroelectronics and Frequency Control, Vol. 44, No. 2, March 1997 which relates amplifier 1/f phase noise with low frequency voltage fluctuations. Modulation of the collector-base capacitance was proposed as a means of converting 1/f voltage noise to 1/f phase noise.

In a paper entitled Reduction of Phase Noise in Linear HBT Amplifiers Using Low-Frequency Active Feedback by Eva S. Ferre-Pikal, IEEE Transactions on Circuits and Systems, Vol. 51, No. 8, August 2004, the author attempted to stabilize a conventionally biased RF transistor by use of an instrumentation amplifier. The instrumentation amplifier was configured in a conventional topology. There was evidence that additional stability of the transistor bias point could suppress 1/f phase noise. However this topology also introduced several additional resistive components as potential sources of noise and had limited noise suppression. These devices were not embedded into or related to low phase noise oscillators.

The desire is to provide an RF oscillator with very low phase noise, including 1/f phase noise. In addition, it is desired to minimize RF power variations with temperature and process variations.

SUMMARY

In accordance with the present disclosure, an oscillator is provided having: (A) a transistor a transistor for producing an oscillating output signal at an output electrode of the transistor; (B) a bias circuit for producing a bias signal for the transistor, said bias circuit including an amplifier coupled to an output electrode of the transistor; and (C) a circuit coupled between an output of the amplifier and a control electrode of the transistor, for isolating the bias signal provided by the amplifier from the oscillating output signal.

In one embodiment, an oscillator circuit is provided having a first feedback loop comprising: a resonator circuit having an input coupled to an output electrode of a transistor and an output coupled to a control electrode of the transistor. The oscillator circuit includes a bias control feedback loop, comprising: a differential amplifier; and a reference voltage coupled to a first input of the differential amplifier. A second input of the differential amplifier is coupled to the output electrode of the transistor. An output of the differential amplifier is coupled to a control electrode of the transistor. A second feedback loop is coupled between the output electrode of the transistor and the control electrode of the transistor.

In one embodiment, the second feedback loop comprises a resistor and a capacitor serially coupled between the output electrode of the transistor and the control electrode of the transistor.

In one embodiment, RF blocking circuit is serially connected between the output electrode of the transistor and the first input of the differential amplifier and wherein the resistor and the capacitor are serially coupled between at node between the pair of serially connected oscillator frequency blocking circuits and the control electrode of the transistor.

In one embodiment, an additional pair of matching and blocking circuits is serially coupled between the output electrode of the transistor and the control electrode of the transistor through the resonator circuit.

The second feedback loop is phase noise suppression circuit and provides additional output electrode to control electrode feedback, serves to reduce the gain and shift the phase of higher frequency AC signals in the biasing control loop, and reduces fluctuations in the output electrode to control electrode of the transistor that are outside the bandwidth of the differential amplifier bias control loop. The second loop also affects the RF gain in the oscillation loop and also stabilizes the critical collector-to-base bias voltage.

In one embodiment, an oscillator circuit is provided having: a transistor; a regenerative feedback loop for producing an output oscillation frequency signal at an output electrode of the transistor having undesirable 1/f voltage noise and associated undesirable phase noise; a negative feedback loop coupled between the output electrode and a control electrode of the transistor for suppressing the 1/f voltage noise and the associated undesirable phase noise at the output electrode; and a circuit coupled between the output electrode and the control electrode for provide a feedback loop to the oscillation frequencies to stabilize operation of the transistor and for coupling intermediate frequencies in the negative feedback loop away from the control electrode to the output electrode of the transistor.

With such an arrangement, phase noise of the oscillator is reduced by actively controlling biasing and low frequency modulation. This invention uses a novel topology to reduce 1/f transistor phase noise and improve oscillator $1/f^n$ phase noise, where n in an integer ranging from 0 to 3. The technique is applicable to a broad class of oscillators.

The details of one or more embodiments of the disclosure are set forth in the accompanying drawings and the description below. Other features, objects, and advantages of the disclosure will be apparent from the description and drawings, and from the claims

DETAILED DESCRIPTION

Figure 1:
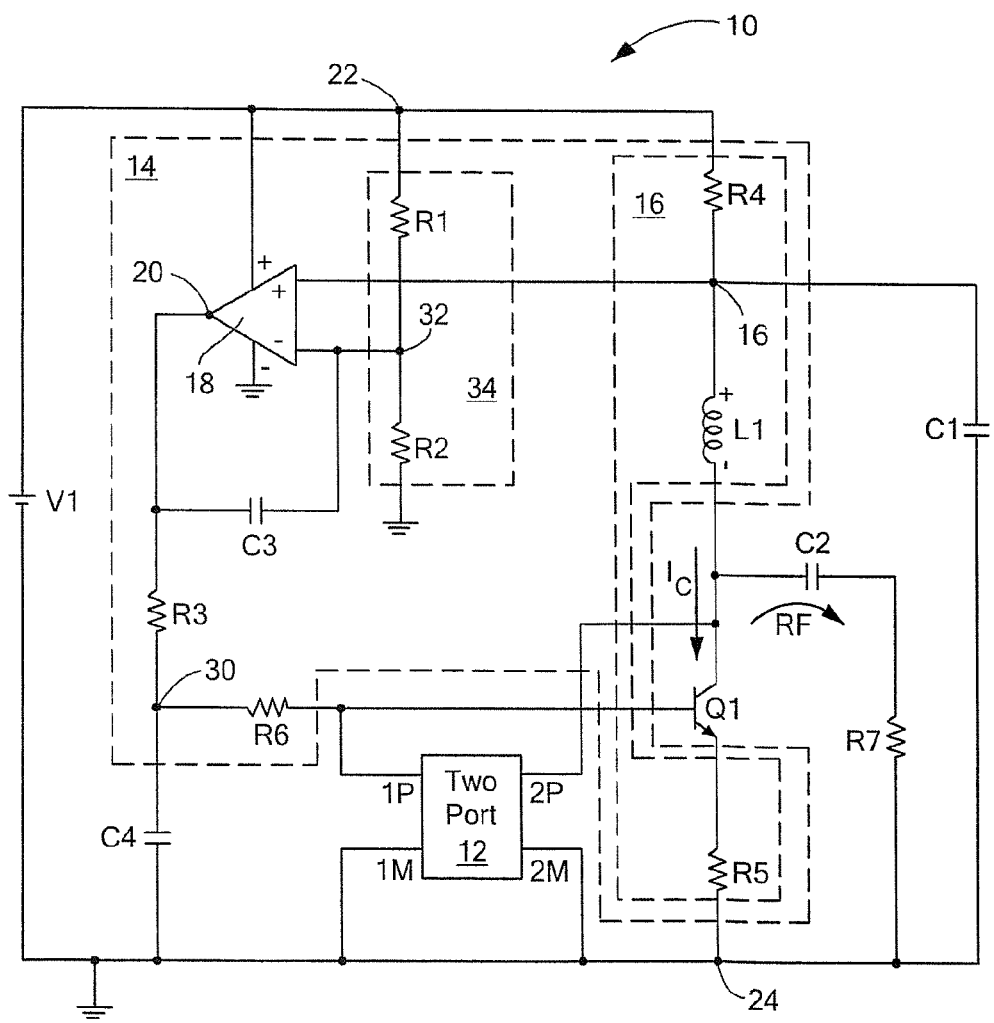
FIG. 1 is an oscillator according to an embodiment of the disclosure.

Referring now to FIG. 1, an oscillator 10 is shown. The oscillator includes a transistor Q1; a resonant circuit 12 coupled between an output electrode, here collector electrode, of the transistor Q1 and a control electrode, here base electrode, of the transistor Q1; and a dc bias circuit 14 for the transistor Q1. The dc bias circuit 14 includes: a voltage producing circuit 16; and a differential amplifier 18. The differential amplifier 18 has: a first input (inverting (−) input) coupled to a fixed reference voltage; a second input (non-inverting (+)) coupled to the voltage producing circuit 16, such voltage producing circuit producing a voltage at the second input (non-inverting (+)) of the difference amplifier 18 related to current Ic passing through the output electrode (collector) of the transistor Q1; and an output 20 coupled to the control electrode (base) of the transistor Q1. A voltage source V1 has: one potential (+) coupled to one terminal of 22 the voltage producing circuit 14; and a second potential (−) coupled to a second terminal 24 of the voltage producing circuit 14. A third terminal 26 of the voltage producing circuit 14 is coupled to the second input (non-inverting (+)) of the differential amplifier 18. The voltage producing circuit 14 includes a first resistor R4 coupled between the first potential and the second input of the differential amplifier (non-inverting (+)) and a second resistor R5 between an additional electrode (emitter) of the transistor Q1 and the second potential (i.e., terminal 24). An inductor L1 is coupled between the second input (non-inverting (+)) of the differential amplifier 18 and the output electrode (collector) of the transistor Q1. A capacitor C3 is coupled between the first input (inverting (−)) of the differential amplifier 18 and the output 20 of the differential amplifier 18. A third resistor R3 and a fourth resistor R6 are connected together at a node 30, such node 30 being coupled to the second potential (i.e., terminal 24) through a capacitor C4, the third resistor R3 being coupled between the output 20 of the differential amplifier 18 and the node 30 and the fourth resistor R6 being coupled between the node 30 and the control electrode (base electrode) of the transistor Q1. The fixed voltage is a voltage produced at node 32 by a resistor divider 34 made up of resisters R1 and R2 coupled between the first and second potentials of the supply V1.

More particularly, the transistor Q1 is the oscillator transistor. The differential amplifier 18 is chosen to have low 1/f voltage noise properties. A resistor R7 is the RF load resistor with typical value of 50 ohms. Inductor L1 is used for RF isolation and may also take the form of a distributed transmission line. Capacitor C1 is a bypass capacitor having very low reactance at the oscillation frequency. The two port device is the resonant feedback circuit 12 and could be a lumped element LC, an acoustic resonator such as SAW, or a distributed resonator such as a transmission line or a dielectric resonator. The two-port could include a means of tuning the oscillator frequency such as a varactor diode.

Here the differential amplifier 18 is used to bias and stabilize the oscillator transistor Q1. Transistor Q1 is shown as a bipolar device, but may also be a FET; in which case the control electrode is the gate electrode and the collector and emitter electrodes are source and drain electrodes. The semiconductor material may be silicon, GaAs, GaN or other semiconductor materials.

Biasing is provided by using as the differential amplifier 18 a differential amplifier having low 1/f voltage noise. For example, commercially available differential amplifiers are available with a typical 1/f voltage noise intercept of less than 10 Hz. A reference voltage formed by the voltage divider of R1 and R2 and also having low 1/f voltage noise is used as the inverting input, and a voltage proportional to collector current of the RF transistor is used as the non-inverting input. The feedback path from the voltage at the R4-L1 node is applied to the positive differential amp input due to the 180 phase shift of transistor Q1 at low frequencies. Effectively the amplifier 19 positive input (non-inverting input (+)) becomes a negative feedback path, and the reference voltage at node 32 is applied to what is commonly used as the negative input to the op-amp. The output 20 from the differential amplifier 18 is used to provide a voltage for biasing the input (here emitter) to the RF transistor Q1. Resistor R3, R6 and capacitor C4 serve to isolate the RF signal from the biasing function and also suppress phase noise. An additional capacitor C3 serves as a phase shift component to establish adequate phase margin and ensure that noise processes are not regenerated by the very high differential voltage gain. The biasing configuration ensures that the voltage of the non-inverting input (+) of the differential amplifier 18 will be essentially equal to the voltage of the inverting input (−). Since the noise at the inverting input (−) is derived from a reference voltage at node 32 with very low noise, the noise at the non-inverting input (+) will also be similarly quiet. Any noise in the collector current Ic of the RF transistor Q1 will now be sensed by the biasing circuit 14 and the voltage present at the base of the RF transistor Q1 will be adjusted to compensate for that noise. Noise which is normally present at the collector of the RF transistor Q1 will essentially be translated back to the base of said transistor Q1. However, since the transistor Q1 has a voltage gain from the collector to base electrode, voltage noise will similarly be reduced by this voltage gain. Noise processes associated with modulation of the collector to base capacitance, and within the bandwidth of the biasing circuitry, will similarly be reduced. Resistor R5 provides additional negative feedback to stabilize the oscillation circuit.

Since the biasing circuitry extends down to DC, the oscillator frequency is also stabilized with respect to variation in temperature and parametric variations of the RF transistor. The circuit can be implemented from discrete devices or as an integrated circuit.

Figure 2:
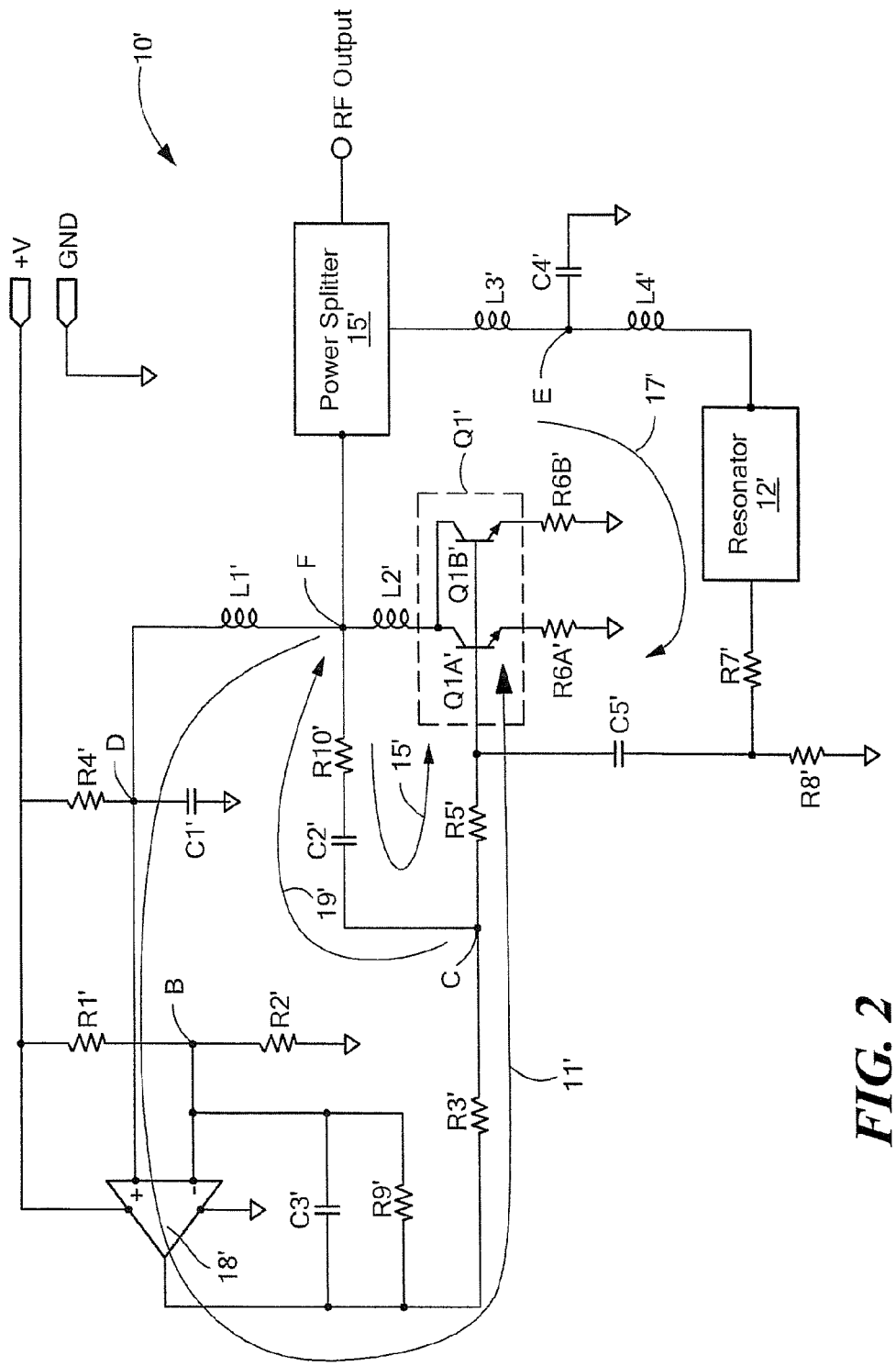
FIG. 2 is an oscillator according to an embodiment of the disclosure.

Referring now to FIG. 2, an oscillator 10', here producing an RF oscillating output signal, is shown having an output transistor arrangement QA' (here made up of a pair of transistors Q1A' and Q2A' having base electrodes connected together, and collector electrodes connected together at node A; the emitter electrode of transistor Q1A' being connected to ground through a resistor R6A' and the emitter electrode of transistor Q2A' being connected to ground though resistor R6B', as shown.

A DC bias control loop 11' is provided having a differential amplifier 18' fed by a reference voltage produced by a voltage divider (made up of resistors R1' and R2', serially connected between a supply voltage, +V, and ground, as shown) at node B and fed to the inverting (+) input of the differential amplifier 18' and a voltage produced at the collector electrodes of transistors Q1A' and Q2A' and fed to the non-inverting (−) input of the differential amplifier 18' through serially connected impedance matching and RF blocking elements, here, for example, inductors L1' and L2', respectively, as shown. The differential amplifier 18' is selected to have low 1/f voltage noise properties. Disposed between node B and the output of the differential amplifier 18' are a resistor R9' and a shunt capacitor C3', as shown. The output of the differential amplifier 18' is fed to the base electrodes of the pair of transistors Q1A' and Q2A' through a pair of serially connected resistors R3' and R5', as shown, to complete the DC bias control loop 11'. It is noted that the resistors R3' and R5' are connected together at a node C; such node C; being connected: to ground through a resistor R8'; and the output of a resonator circuit 12' through resistor R7'. Note that a resistors R4' and capacitor C1' are connected together at node D and are serially connected between the voltage supply, +V, and ground.

An oscillator frequency, here an RF frequency, feedback loop 17' is provided. The oscillator frequency feedback loop 17' includes: power splitter 15' fed by the output (collector electrodes) of the pair of transistors Q1A' and Q2A'; a pair of serially inductors L3' and L4' (and capacitor C4' connected between ground and a node E connected to the pair of inductors L3' and L4' as shown); the resonator circuit 12' having an input coupled to the output of the pair of transistors Q1A' and Q2A' (the collector electrodes of the pair of transistors Q1A' and Q2A'); and the resistor R7' connecting the output of the resonator circuit 12' to the base electrodes of the pair of transistors Q1A' and Q2A' through capacitor C5', to complete the oscillator frequency feedback loop 17'. A second output of the power splitter 15' provides the output of the oscillator 10', as indicated. The pair of serially inductors L3' and L4' and capacitor C4' provide the proper positive (regenerative) phase shift for the feedback loop 17'. The pair of transistors Q1A' and Q2A' provide RF gain and resistors R6A' and R6B' provide some emitter feedback and gain stabilization.

The resistors R7' and R8' reduce the RF power level slightly but also control the impedance presented to the control electrode (base) of Q1A' and Q2A'. Resonator 12' may have an impedance not ideal for low phase noise signal generation away from the resonator frequency and resistors R7' and R8' control this impedance. The RF blocking structure, here inductor L1', is used for RF isolation from the voltage source +V and from the non-inverting input of the differential amplifier 18' and may also take the form of a distributed transmission line. Capacitor C1' is a bypass capacitor having very low reactance at the oscillation RF frequency to thereby direct any RF energy to ground.

The resonator circuit 12' is a two port and may be, for example, a lumped element LC, an acoustic resonator such as SAW, or a distributed resonator such as a transmission line or a dielectric resonator. The two-port may, for example, include a means of tuning the oscillator frequency such as a varactor diode.

The differential amplifier 18'; is used to bias and stabilize the oscillator transistors Q1A' and Q1B.' Alternatively, transistor Q1B' and resistor R6B' may be eliminated to produce a simpler, but lower cost oscillator. Transistors Q1A' and Q1B' are referred to as Q1' herein. Resistors R6A' and R6B' are referred to as R6' herein. Transistor Q1' is shown as a bipolar device, but may also be a FET. The semiconductor material may be silicon, GaAs, GaN or other semiconductor materials.

Devices Q1', C2', R5', L1' and L2' are combined to produce both low frequency and RF gain from the base of transistor Q1' to the collector. The power splitter 15' directs a portion of the RF power to the RF output and a portion of the RF power into inductor L3'. The power splitter 15' is of any well-known power splitter, here for example Mini Circuits, Brooklyn, N.Y., model HPQ-05. Inductors L3', capacitor C4' and inductor L4' shift the phase of the RF power into the resonator 12'. The resonator 12' is a high Q two port device such as a crystal, SAW, cavity or MEMS resonator and may include means of tuning the resonator such as with varactor diodes. Resistors R7' and R8' reduce the RF power into the base electrode of transistor Q1' such that the overall gain through loop 17' is approximately 3 dB. In addition, resistors R7' and R8' stabilize the impedance presented to the base control electrode of transistor Q1' at frequencies which are offset from the peak amplitude of the resonator, but still of interest in the overall phase noise spectrum of the oscillator 10'.

Biasing is provided by using as the differential amplifier 18'; a differential amplifier having low 1/f voltage noise. For example, commercially available differential amplifiers such as the OP27 manufactured by Analog Devices, Norwood, Mass., are available with a typical 1/f voltage noise intercept of less than 10 Hz.

A reference voltage formed by the voltage divider of R1' and R2' at node B and also having low 1/f voltage noise is used as the inverting input of the differential amplifier 18', and a voltage proportional to collector current of the RF transistor Q1' is used as the non-inverting input. The feedback path 11' from the voltage at the R4'-L1' node is applied to the positive differential amplifier 18' input due to the 180 phase shift of transistor Q1' at low frequencies. Effectively the amplifier 18' non-inverting (positive) input becomes a negative feedback path 11', and the reference voltage at node B is applied to what is commonly used as the inverting (negative) input to the operational amplifier 18'. The output from the differential amplifier 18' is used to provide a voltage for biasing the input to the RF transistor Q1' Resistor R3' serves to isolate the RF signal from the DC biasing function. Resistor R5' allows the control signal for Q1' to be applied to the base electrode of transistor Q1'.

Thus, as described above, there are two feedback loops: (1) The feedback loop 17' which is a positive, regenerative feedback loop that produces the desired oscillation frequency signal, here the RF output signal of the oscillator 10'; however, this loop 17' includes undesirable voltage noise and associated unwanted phase noise at the collector electrode of transistor Q1'; and, (2) The negative, degenerative feedback loop 11' for unwanted suppressing 1/f voltage noise and associated unwanted phase noise in the collector of transistor Q1'. The transistor Q1' collector and base control electrodes are shared in both feedback loops 11' and 17'. The output of the differential amplifier 18' provides enough DC voltage at the base control electrode of transistor Q1' so that the voltage at node D will be nearly identical to the voltage at node B. In addition, the very low noise voltage at node B will now be reflected to node D, including 1/f noise voltage. Since inductor L1' and L2' will be nearly short circuits for low frequency signals, the voltage at the collector of transistor Q1' will have very low voltage noise at low frequencies, including the critical frequencies where 1/f voltage noise is significant. Feedback loop 11' will generate a current in the collector of transistor Q1' that is equal in magnitude but opposite in phase to the inherent collector noise current of transistor Q1'. This noise is translated to the base control electrode of transistor Q1' by the feedback loop 11'. Low frequency noise at the collector of transistor Q1' is suppressed by the action of feedback loop 11'. Transistor Q1' can have voltage gain from the base control electrode to the collector electrode. This voltage gain will be approximately R4'/(1/gm+R6'), where gin is the transistor Q1' transconductance. Since feedback loop 11' controls the voltage at node D and thereby the collector voltage of transistor Q1' for low frequencies, the signal generated by feedback loop 11' at the base control electrode of transistor Q1' will be reduced by the ratio of the low frequency gain of Q1'. Since the collector electrode voltage noise is now suppressed, and the base electrode voltage noise is also reduced by the low frequency voltage gain of Q1', the total collector-to-base voltage noise will be reduced by feedback loop 11'. The noise reduction extends down to DC and includes the critical region where 1/f voltage noise would otherwise be significant. Since phase noise of a transistor is known to be affected by collector-to-base voltage noise, the low frequency phase noise of Q1' is now reduced by feedback loop 11', including 1/f phase noise. However, there are intermediate frequencies in the feedback loop 11' where the effect of feedback loop 11' alone would increase voltage noise and hence phase noise of transistor Q1'. These intermediate frequencies would be reflected in the phase noise floor of the RF oscillation frequency with typical values ranging from 10 kHz to 40 MHz. A large degree of phase margin is required in the DC bias loop 11', such as 60 degrees or more. Phase margin less than 60 degrees will result in amplification of phase noise, producing increased phase noise in the region with lower phase margin. Lower phase margin results in elevated regions of phase noise in the phase noise floor of the RF oscillation signal.

To improve the phase margin an additional oscillator frequency negative feedback loop 15' is provided to suppress the phase noise at the collector electrode of transistor Q1'. The additional oscillator frequency feedback loop 15' is a phase noise suppression circuit and includes the resistor R5' and capacitor C2' and resistor R10'. This additional loop 15' serves to suppress phase noise in the RF loop 17' via reduced voltage noise in the collector-to-base noise voltage of transistor Q1'.

Capacitor C2' and resistor R10' are serially connected between node F and node C. At the intermediate frequencies resistor R10' and capacitor C2' have a low impedance and are have a shared path with feedback loop 11'. Resistor R10' and capacitor C2' reduce the gain of feedback loop 11' by the amount that otherwise be generated by transistor Q1'. Resistor R10' and capacitor C2' act as a high pass filter, shunting, via path 19'; a portion of the control signal of feedback loop 11' around transistor Q1' at the above-mentioned intermediate frequencies (i.e., away from the loop 11', and hence away from the control electrode, directly to the collector electrode). Resistor R5', along with the capacitor C2', additionally provides collector-base RF feedback from the junction (node F) of inductors L1' and L2' at the collector electrode of transistor Q1' to the base electrode of transistor Q1'. Thus, the additional phase noise suppression circuit feedback loop 15' is from the collector electrode of transistor Q1', through the inductor L2', through resistor R10', capacitor C2', through resistor R5', and back to the collector electrode of transistor Q1', as shown. The feedback is a negative feedback because of the 180 degree phase shift between the base and collector of transistor Q1'. Capacitor C2' is selected to be an RF bypass capacitor and serves to reduce the gain and shift the phase of intermediate frequency signals in the biasing control loop. Additionally, capacitor C2' reduces collector electrode to base electrode voltage noise of transistor Q1' that are outside the bandwidth of the differential amplifier 18' DC bias control loop 11'. The DC biasing configuration ensures that the voltage of the non-inverting input of the differential amplifier 18' will be essentially equal to the voltage of the inverting input of such differential amplifier 18'. Since the 1/f voltage noise at the inverting input is derived from a reference voltage at node B with very low 1/f voltage noise, the 1/f voltage noise at the non-inverting input will also be similarly quiet. Any 1/f voltage noise in the collector current of the RF transistor Q1' will now be sensed by the DC feedback biasing circuit 11' and the voltage present at the base of the RF transistor Q1' will be adjusted to compensate for that voltage noise. Phase noise, which is normally present at the collector of the RF transistor Q1', will essentially be translated back to the base of said transistor Q1'. However, since the transistor Q1' has a voltage gain from the base to the collector, 1/f voltage noise will similarly be reduced by this voltage gain. Phase noise processes associated with modulation of the collector-to-base capacitance, and within the bandwidth of the DC biasing circuitry 11', will be proportionally reduced. Resistor R5' provides additional negative feedback to stabilize the oscillation circuit 10'. Capacitor C2' is selected to be an RF bypass capacitor preventing DC from passing through the additional oscillator frequency feedback loop 15. Resistors R5' and R10' provide RF feedback from the collector electrode back to the control electrode of transistor Q1' and are selected to provide approximately 3 dB of gain around the RF frequency feedback loop 17'. Together, capacitor C2', R5' and R10' influence the effects of the DC biasing control by affecting the gain and phase margin of the DC biasing loop 11'. While computer analysis of the low frequency loop gain and phase characteristics provide insight into proper values, non-linear effects also influence the circuit behavior. In particular, capacitors C2', R5' and R10' (i.e., the additional oscillator frequency phase noise suppression circuit feedback loop 15') influence the phase noise floor of the RF oscillation signal. The phase noise floor is the region of frequencies offset from the RF oscillation frequency which is outside of the three dB bandwidth of the resonator circuit 12'. The additional phase noise suppression circuit feedback loop 15' provides additional phase margin in the DC bias control loop 11' to improve phase noise in Q1' at the intermediate frequencies. The additional phase noise suppression circuit feedback loop 15' also serves to stabilize the collector-to-base voltage of Q1' resulting in further suppression of the phase noise of Q1'. Absent the additional phase noise suppression circuit feedback loop 15', phase noise of transistor Q1' would increase dramatically at the intermediate frequencies. Further, the intermediate frequencies at node C passing to the base of transistor Q1' and the intermediate frequencies at node C passing through the capacitor C2' and R10; tend to cancel each other at the collector electrode of transistor Q1. Thus, a circuit, having resistors R5', R3', R10' and capacitor C2' suppress phase noise in the oscillating output frequency signal appearing at the collector of transistor Q1', as described above. Resistor R3' isolates the bias signal provided by amplifier 18' from the produced oscillating signal present at node C.

Since the biasing circuitry 11' extends down to DC, the oscillator frequency is thus stabilized with respect to variation in temperature and parametric variations of the RF transistor. The circuit 10' can be implemented from discrete devices or as an integrated circuit.

Thus, the oscillator circuit 10' includes a regenerative feedback loop 17' for producing an output oscillation frequency signal at an output electrode of the transistor Q1' having undesirable 1/f voltage noise and associated undesirable phase noise. A negative feedback loop 11' is coupled between the output electrode and a control electrode of the transistor Q1' for suppressing the 1/f voltage noise and the associated undesirable phase noise at the output electrode. A circuit having capacitor C2' and R10' and R5' is coupled between the output electrode and the control electrode for provide the feedback loop 15' to the oscillation frequencies to stabilize operation of the transistor Q1' and includes a path 19', having the capacitor C2' and R10', for coupling intermediate frequencies in the negative feedback loop 11' away from the control electrode to the output electrode of the transistor Q1'. This circuit, having resistors R3' R5', R10' and capacitor C2' suppress phase noise in the oscillator.

An exemplary set of values for elements in oscillator circuit 10', here for producing an oscillator frequency of the output of the power splitter 15' of approximately 450 MHz are:

+V is 10 volts;
R1'=383 ohms'
R2'=845 ohms;
R3'=510 ohms'
R4'=75 ohms
R5'=400 ohms
R6A'=5 ohms
R6B'=5 ohms
R7'=20 ohms
R8'=100 ohms
C1'=100 pF
C2'=0.05 pF
C3'=1000 pF
C4'=10 pF
L1'=390 nH
L2'=5 nH
L3'=15 nH
L4'=15 nH A number of embodiments of the invention have been described. Nevertheless, it will be understood that various modifications may be made without departing from the spirit and scope of the invention. For example, the invention applies to crystal, SAW, LC and microwave resonant oscillators, and can be implemented with discrete components or as integrated circuit devices. Additionally, inductors and capacitors could be replaced with equivalent function distributed elements, such as microstrip transmission lines, for use at microwave frequencies. Further, the resistor R10' may be removed (i.e., R10'=0). Accordingly, other embodiments are within the scope of the following claims.

What is claimed is:

1. An oscillator comprising:
   (A) a transistor;
   (B) a resonant circuit coupled between an output electrode of the transistor and a control electrode of the transistor;
   (C) a bias circuit for producing a bias signal for the transistor, said bias circuit comprising:
       an amplifier coupled to the output electrode of the transistor;
       a pair of resistors serially coupled between an output of the amplifier and the control electrode of the transistor; and
       wherein the pair of resistors is connected to a node in the bias circuit;
   (D) a circuit for stabilizing operation of the oscillator comprising: an additional resistor and a capacitor serially coupled between the node in the bias circuit and the output electrode of the transistor.

2. An oscillator comprising:
   (A) a transistor;
   (B) a resonant circuit coupled between an output electrode of the transistor and a control electrode of the transistor;
   (C) a dc bias circuit for producing a bias signal for the transistor, such bias circuit comprising:
       (i) a voltage producing circuit;
       (ii) a differential amplifier having:
           (a) a first input;
           (b) a second input coupled to the voltage producing circuit, such voltage producing circuit producing a voltage at the second input of the difference amplifier related to current passing through the output electrode of the transistor;
           (c) an output;
       (iii) a circuit, comprising:
           (a) a first resistor;
           (b) a second resistor connected to the first resistor at a node;
           (c) wherein the first resistor is coupled between the output of the differential amplifier and the node;
           (d) wherein the second resistor is coupled between the node and the control electrode of the transistor to provide the bias signal; and
   (E) a circuit for stabilizing operation of the oscillator comprising: a third resistor and a capacitor serially coupled between the node in the bias circuit and the output electrode of the transistor.

3. The oscillator recited in claim 2 wherein the circuit comprising the third resistor and the capacitor have a resistance and capacitance selected to suppress phase noise.

4. The oscillator recited in claim 2
   a circuit coupled between the output electrode and the control electrode for providing a feedback loop to the oscillation frequencies to stabilize operation of the transistor and for coupling intermediate frequencies in the negative feedback loop away from the control electrode to the output electrode of the transistor.

5. An oscillator, comprising:
   a transistor;
   a first feedback loop comprising:
       a resonator circuit having an input coupled to an output electrode of the transistor and an output coupled to a control electrode of the transistor;

a bias control feedback loop, comprising:
  a differential amplifier;
  a reference voltage coupled to a first input of the differential amplifier;
  wherein a second input of the differential amplifier is coupled to the output electrode of the transistor; and
  wherein an output of the differential amplifier is coupled to a control electrode of the transistor; and
a second feedback loop coupled between the output electrode of the transistor and the control electrode of the transistor for supressing phase noise in the oscillator;
wherein the second feedback loop comprises a resistor and a capacitor serially coupled between the output electrode of the transistor and the control electrode of the transistor;
including an oscillator frequency blocking circuit having a pair of inductors serially connected between the output electrode of the transistor and the first input of the differential amplifier.

6. The oscillator recited in claim 5 including an additional pair of oscillator frequency blocking circuits serially coupled between the output electrode of the transistor and the control electrode of the transistor through the resonator circuit.

7. An oscillator, comprising:
a transistor;
a first feedback loop comprising:
  a resonator circuit having an input coupled to an output electrode of the transistor and an output coupled to a control electrode of the transistor;
a bias control feedback loop, comprising:
  a differential amplifier;
  a reference voltage coupled to a first input of the differential amplifier;
  wherein a second input of the differential amplifier is coupled to the output electrode of the transistor; and
a second feedback loop coupled between the output electrode of the transistor and the control electrode of the transistor for supressing phase noise in the oscillator;
  wherein an output of the differential amplifier is coupled to the control electrode of the transistor through a first resistor and a serially connected second resistor, the first and second resistors being connected at a node, and wherein the second feedback loop is connected between the node and the output electrode of the transistor; and
wherein second feedback loop includes an oscillator frequency blocking circuits coupled between the capacitor and the output electrode of the transistor wherein the second feedback loop includes the capacitor coupled between the node and the output electrode of the transistor.

8. An oscillator, comprising:
a transistor;
a first feedback loop comprising:
  a resonator circuit having an input coupled to an output electrode of the transistor and an output coupled to a control electrode of the transistor;
a bias control feedback loop, comprising:
  a differential amplifier;
  a reference voltage coupled to a first input of the differential amplifier;
  wherein a second input of the differential amplifier is coupled to the output electrode of the transistor; and
a second feedback loop coupled between the output electrode of the transistor and the control electrode of the transistor for supressing phase noise in the oscillator;
  wherein an output of the differential amplifier is coupled to the control electrode of the transistor through a first resistor and a serially connected second resistor connected, the first and second resistors being connected at a node, and wherein the second feedback loop is connected between the node and the output electrode of the transistor;
including a capacitor and pair of oscillator frequency blocking circuits serially connected between the output electrode of the transistor and the first input of the differential amplifier and wherein the node between the first and second resistors is coupled to a node between the pair of serially connected inductors through the capacitor.

9. An oscillator, comprising:
a transistor;
a regenerative feedback loop for producing an output oscillation frequency signal at an output electrode of the transistor having undesirable voltage noise and associated undesirable phase noise;
a negative feedback loop coupled between the output electrode and a control electrode of the transistor for suppressing the voltage noise and the associated undesirable phase noise at the output electrode; and
a circuit coupled between the output electrode and the control electrode for providing a feedback loop to the oscillation frequencies to stabilize operation of the transistor and for coupling intermediate frequencies in the negative feedback loop away from the control electrode to the output electrode of the transistor.

10. The oscillator recited in claim 9 wherein the circuit includes a resistor and a capacitor serially coupled between the negative feedback loop and the output electrode of the transistor.

11. An oscillator, comprising:
a transistor;
a resonator circuit having an input coupled to an output electrode of the transistor and an output coupled to a control electrode of the transistor;
a bias control feedback loop, comprising:
  a differential amplifier;
  a reference voltage coupled to a first input of the differential amplifier;
  wherein a second input of the differential amplifier is coupled to the output electrode of the transistor; and
  a first resistor and a second resistor serially coupled between an output of the differential amplifier and the control electrode of the transistor;
circuit coupled to the node, comprising:
  a third resistor coupled between the node;
  a capacitor serially coupled to the third resistor;
    wherein the third resistor and serially coupled capacitor are serially connected between the node and the output electrode of the transistor.

12. An oscillator, comprising:
a transistor;
a resonator circuit having an input coupled to an output electrode of the transistor and an output coupled to a control electrode of the transistor;
a differential amplifier;
a reference voltage coupled to a first input of the differential amplifier;
wherein a second input of the differential amplifier is coupled to the output electrode of the transistor;
a circuit coupled to an output of the differential amplifier, comprising:
  a first resistor;
  a second resistor;

wherein the first resistor and the second resistor are serially coupled between the output of the differential amplifier and the control electrode of the transistor;
a capacitor;
a third resistor;
wherein the capacitor and serially coupled third resistor are connected between: a node between the first resistor and the second resistor; and, and the output electrode of the transistor.

13. An oscillator, comprising:
a transistor;
a first circuit comprising:
   a resonator circuit having an input coupled to an output electrode of the transistor and an output coupled to a control electrode of the transistor;
a second circuit, comprising:
   a differential amplifier coupled to the output electrode of the transistor; and
   a first resistor and a second resistor serially coupled between an output of the differential amplifier and a control electrode of the transistor; and
   wherein the first resistor and the second resistor are connected to a node in the second circuit;
a third circuit coupled between the node and the output electrode of the transistor, the third circuit comprising:
   a third resistor;
   a capacitor serially coupled to the third resistor;
   wherein the third resistor and serially coupled capacitor are coupled between the node and the output electrode of the transistor.

* * * * *